(12) United States Patent
Taguchi et al.

(10) Patent No.: US 11,448,668 B2
(45) Date of Patent: Sep. 20, 2022

(54) CURRENT DETECTION CIRCUIT, CURRENT DETECTION SYSTEM, AND METHOD OF ADJUSTING CURRENT DETECTION CIRCUIT

(71) Applicants: Kabushiki Kaisha Toshiba, Tokyo (JP); Toshiba Electronic Devices & Storage Corporation, Tokyo (JP)

(72) Inventors: Kazuhiro Taguchi, Yokohama Kanagawa (JP); Akihiro Murayama, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 65 days.

(21) Appl. No.: 17/016,571

(22) Filed: Sep. 10, 2020

(65) Prior Publication Data

US 2021/0278444 A1   Sep. 9, 2021

(30) Foreign Application Priority Data

Mar. 3, 2020   (JP) .............................. JP2020-035515

(51) Int. Cl.
*G01R 19/00* (2006.01)
*G01R 19/257* (2006.01)
*G01R 19/165* (2006.01)

(52) U.S. Cl.
CPC ..... *G01R 19/0023* (2013.01); *G01R 19/0092* (2013.01); *G01R 19/16571* (2013.01); *G01R 19/257* (2013.01)

(58) Field of Classification Search
CPC ............ G01R 19/0023; G01R 19/0092; G01R 19/16571; G01R 19/257; G01R 1/30
See application file for complete search history.

(56) References Cited

U.S. PATENT DOCUMENTS

| 6,198,315 B1* | 3/2001 | Nakano | ...................... | H02P 7/29 327/110 |
|---|---|---|---|---|
| 2005/0157607 A1* | 7/2005 | Lin | ........................ | G11B 7/094 369/44.11 |
| 2012/0235656 A1* | 9/2012 | Otsuka | ................ | H02M 3/1588 323/282 |

(Continued)

FOREIGN PATENT DOCUMENTS

| JP | H09-024846 A | 1/1997 |
|---|---|---|
| JP | 2000-166279 A | 6/2000 |

(Continued)

*Primary Examiner* — Dominic E Hawkins
(74) *Attorney, Agent, or Firm* — Allen & Overy LLP

(57) ABSTRACT

According to one embodiment, a current detection circuit includes a current detection part including an operational amplifier configured to compare a first voltage proportional to a load current with a second voltage proportional to a detection current. The current detection part is configured to output the detection current. The current detection circuit includes an adjustment part configured to generate data in accordance with a result of comparing a monitor voltage proportional to the detection current with a reference voltage, and to adjust an input offset of the operational amplifier.

18 Claims, 8 Drawing Sheets

(56) References Cited

U.S. PATENT DOCUMENTS

| | | | |
|---|---|---|---|
| 2013/0193992 A1* | 8/2013 | Kato | G01R 19/0092 |
| | | | 324/713 |
| 2014/0354288 A1* | 12/2014 | Seon | H02H 3/08 |
| | | | 324/424 |
| 2016/0274152 A1 | 9/2016 | Seki | |
| 2020/0044413 A1* | 2/2020 | Stark | H01S 5/0261 |

FOREIGN PATENT DOCUMENTS

| | | |
|---|---|---|
| JP | 2006-211799 A | 8/2006 |
| JP | 2007-295660 A | 11/2007 |
| JP | 2016-176823 A | 10/2016 |

\* cited by examiner

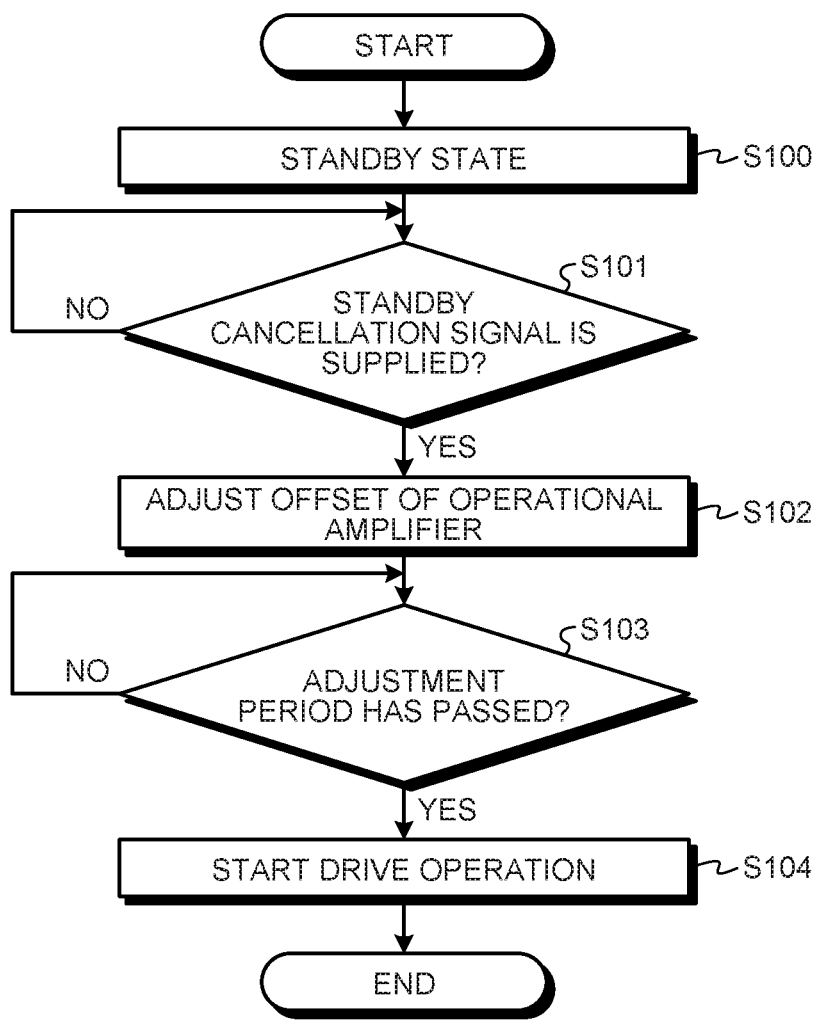

CURRENT DETECTION CIRCUIT, CURRENT DETECTION SYSTEM, AND METHOD OF ADJUSTING CURRENT DETECTION CIRCUIT

CROSS-REFERENCE TO RELATED APPLICATIONS

This application is based upon and claims the benefit of priority from Japanese Patent Application No. 2020-35515, filed on Mar. 3, 2020; the entire contents of which are incorporated herein by reference.

FIELD

Embodiments described herein relate generally to a current detection circuit, a current detection system, and a method of adjusting a current detection circuit.

BACKGROUND

Conventionally, in a current detection circuit including an operational amplifier, a technology has been disclosed that applies a voltage to shift the offset of the operational amplifier to eliminate the dead zone of the load current. The input offset voltage of the operational amplifier affects the detection dead zone of the load current and the offset of the detection current. In a case where a different offset voltage is added to the input of the operational amplifier to shift the detection current, there is no dead zone, but there is no effect on the variation of the detection current due to the input offset voltage. That is, there is a problem in that the variation of the detection current for a constant load current is not improved. Further, the input offset voltage of the operational amplifier changes with time. Accordingly, it is desirable to provide a current detection circuit, a current detection system, and a method of adjusting a current detection circuit, in which the input offset voltage is adjusted to be close to zero when the load current needs to be detected, and the current offset at the no-load time is small.

BRIEF DESCRIPTION OF THE DRAWINGS

FIG. 9 is a flowchart illustrating the offset adjustment method.

DETAILED DESCRIPTION

In general, according to one embodiment, the current detection circuit includes a current detection part including an operational amplifier configured to compare a first voltage proportional to a load current supplied to a load through a drive element with a second voltage proportional to a detection current, and to be adjustable in an input offset voltage by data. The current detection part is configured to output the detection current on a basis of an output of the operational amplifier. The current detection circuit includes an adjustment part configured to generate the data in accordance with a result of comparing a monitor voltage proportional to the detection current with a reference voltage, and to adjust an offset of the operational amplifier.

Exemplary embodiments of a current detection circuit and a current detection system will be explained below in detail with reference to the accompanying drawings. The present invention is not limited to the following embodiments.

First Embodiment

Figure 1:
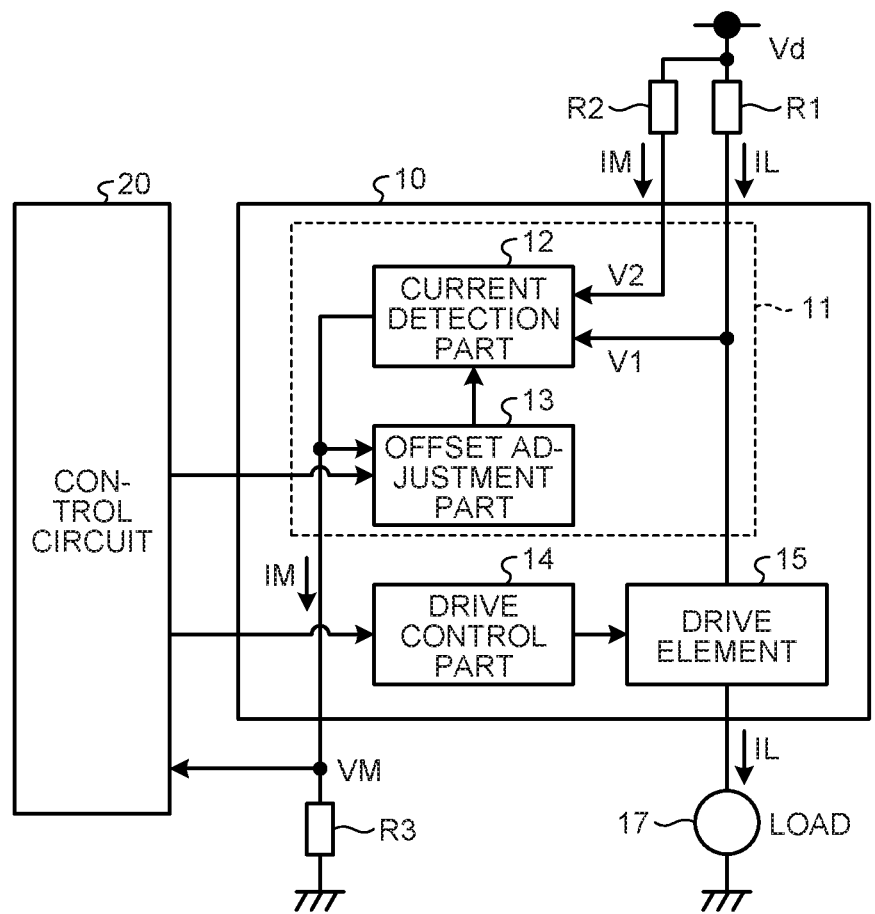
FIG. 1 is a diagram illustrating a configuration of a current detection system according to a first embodiment.

FIG. 1 is a diagram illustrating a current detection system according to a first embodiment. The current detection system according to this embodiment includes a drive circuit 10 and a control circuit 20. The drive circuit 10 includes a current detection circuit 11, a drive control part 14, and a drive element 15. In the drive circuit 10, a load 17 is connected to the drive element 15, resistors R1 and R2 are connected to the power supply terminal side, and a resistor R3 is connected to the ground terminal side. The current detection system uses the current detection circuit 11 to monitor a load current IL flowing through the drive element 15, which drives the load 17 requiring relatively high power, so that the control circuit 20 can perform monitoring.

The current detection circuit 11 includes a current detection part 12 and an offset adjustment part 13. The current detection part 12 outputs a monitor current IM to the resistor R3 in accordance with voltages V1 and V2. The voltage V1 is a voltage dropped from the power supply voltage Vd by a voltage generated in the resistor R1 by the load current IL. The voltage V2 is a voltage dropped from the power supply voltage Vd by a voltage generated in the resistor R2 by the monitor current IM.

The current detection part 12 is equipped with a negative feedback circuit including an operational amplifier (not illustrated) that amplifies the voltage difference between the voltage V1 and the voltage V2. The negative feedback circuit controls and outputs the monitor current IM to cause the voltage difference between the voltage V1 and the voltage V2 to be zero. Accordingly, the current flowing through the resistor R2 can be set by the ratio between the resistance values of the resistor R1 and the resistor R2. For example, when the resistance value of the resistor R2 is set to K times that of the resistor R1 (K is an arbitrary positive number of 1 or more), the current detection part 12 outputs the monitor current IM reduced to 1/K times the load current IL.

The offset adjustment part 13 adjusts the input offset voltage of the operational amplifier of the current detection part 12. For example, the offset adjustment part 13 adjusts the input offset voltage of the operational amplifier to cause the monitor voltage VM generated in the resistor R3 to be equal to a reference voltage.

The control circuit 20 is formed of a microcomputer, for example. The control circuit 20 supplies an adjustment start signal that causes the offset adjustment part 13 to start offset adjustment. The adjustment start signal is output in response to an operation instruction from the user, for example. The operation instruction from the user is a request that requires supply of the load current IL to the load 17. For example, in a case where the load 17 is a motor for driving a power window of an automobile, the operation instruction from the user is an instruction for opening/closing the power window.

The control circuit 20 supplies a drive control signal to the drive control part 14. The drive control part 14 generates a drive signal in response to the drive control signal, and supplies the drive signal to the drive element 15. The drive element 15 is turned on in response to the drive signal, and supplies the load current IL to the load 17.

As a result of the load current IL flowing, the monitor current IM is supplied to one end of the resister R3 through the current detection part 12. The other end of the resistor R3 is grounded. The monitor current IM is a current reduced at a predetermined ratio with respect to the load current IL, for example. Thus, the monitor voltage VM is a voltage according to the load current IL. For example, the monitor voltage VM is subjected to AD conversion in the control circuit 20, and is detected as a digital value.

Figure 2:
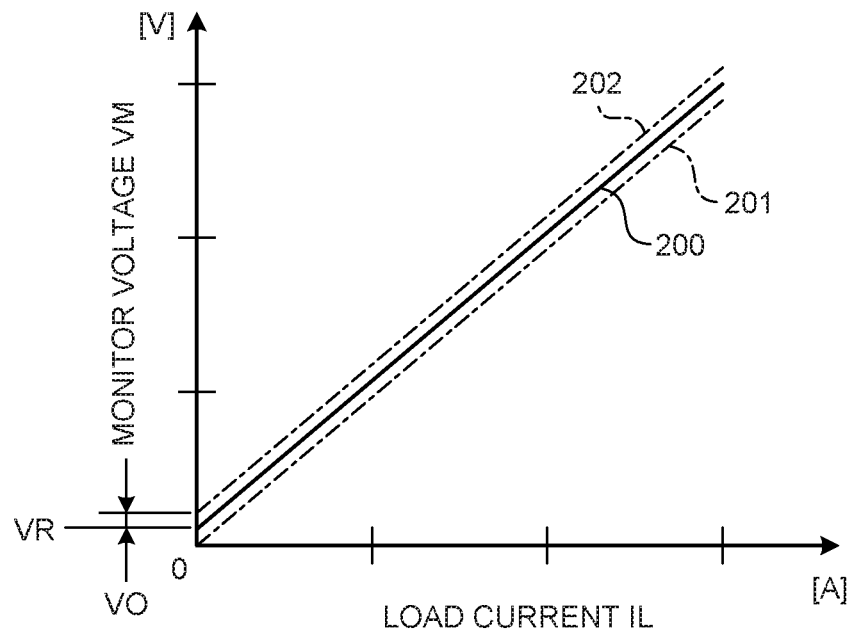
FIG. 2 is a diagram illustrating the relationship between a load current and a monitor voltage.

Next, an explanation will be given of offset adjustment performed by the offset adjustment part 13, with reference to some drawings. FIG. 2 is a diagram illustrating the relationship between the load current IL and the monitor voltage VM. Here, the horizontal axis indicates the load current IL, and the vertical axis indicates the monitor voltage VM. VR denotes a reference voltage. A solid line 200 shows a characteristic set by this embodiment. Chain lines 201 and 202 show cases where shifts by a voltage VO have occurred on the plus side and the minus side, respectively, depending on the input offset voltage of the operational amplifier. As the load current IL increases, the monitor voltage VM increases linearly. When a shift has occurred on the minus side, the monitor voltage VM sticks to zero and cannot be monitored linearly.

When the drive element 15 is in a cutoff state and the load current IL is thereby zero, the offset adjustment part 13 adjusts the offset of the current detection part 12 so that a voltage equal to the reference voltage VR can be generated as the monitor voltage VM. Consequently, the drive element 15 is turned on, and makes it possible to avoid the dead zone in which the load current IL is not detected even though the load current IL is flowing. In the offset adjusting process, in order to converge the adjustment in one direction, the reference voltage VR cannot be set to zero, i.e., the GND potential. On the other hand, if the reference voltage VR is set to a potential higher than the GND, the input offset voltage VO of the operational amplifier ends up being adjusted to a large state in order to match the monitor voltage VM with the reference voltage VR. Therefore, it is desirable to set the reference voltage VR to a voltage that is slightly higher than the GND but can be converged by the adjusting process. For example, it is assumed that, where the input offset voltage VO is ±10 mV, the reference voltage VR is 0.1 V.

In the case of control of an automobile body system, such as a power window, the no-load current is observed in a period before the motor starts operating. In the period before the motor starts operating, i.e., immediately before the drive element 15 is driven by the drive control part 14, an adjustment start signal is output each time from the control circuit 20 so that the offset adjustment of the current detection part 12 can be performed. Consequently, even if the input offset voltage of the operational amplifier changes with time, or even if the temperature drifts, since the adjustment can be performed before the load current IL is supplied to the load 17, it is possible to configure a current detection system that detects with high accuracy the load current IL at the driving time of the drive circuit 10. For example, it is possible to accurately detect a state where the load current IL is in an over-current condition because a finger or the like of the user is caught during the operation of closing the power window of the automobile. Further, a practical current detection system can be provided by adopting a configuration in which the offset adjustment of the current detection part 12 is completed within a predetermined time, in response to an adjustment start signal from the control circuit 20 each time.

Figure 3:
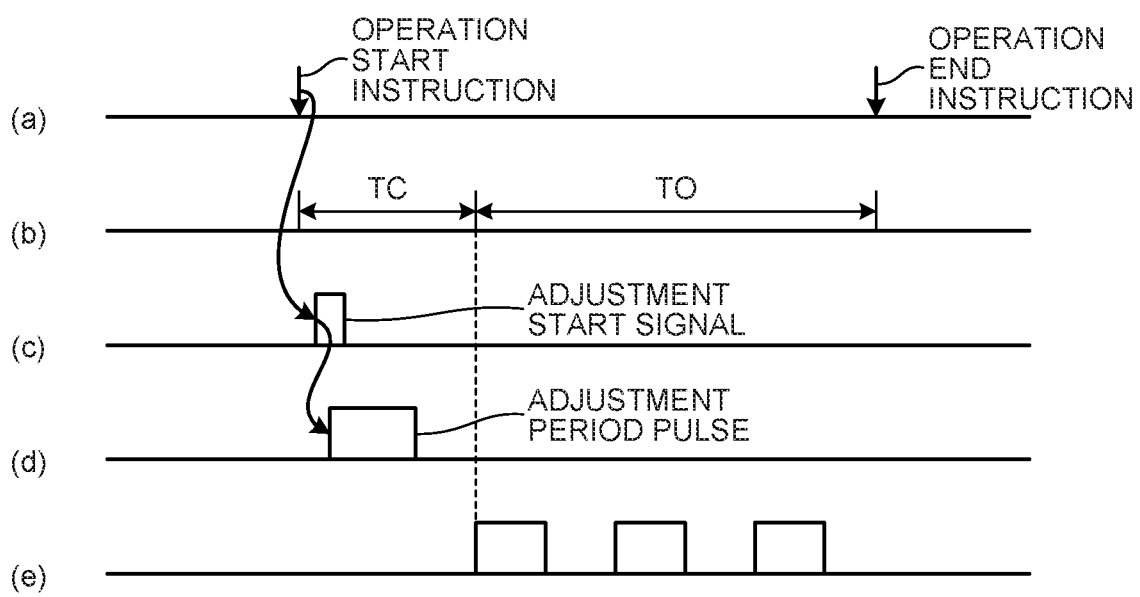
FIG. 3 is a timing chart illustrating an offset adjustment method.

FIG. 3 is a timing chart illustrating an offset adjustment method according to the first embodiment. From the top, FIG. 3 sequentially shows the user control, the distribution of operation periods, the adjustment start signal, an adjustment period pulse, and the drive control signal. In FIG. 3, (a) indicates an operation start instruction and an operation end instruction from the user.

In FIG. 3, (b) indicates time distribution set by the control circuit 20. TC denotes a diagnosis period, and TO denotes an operation period. The diagnosis period TC starts in response to the operation start instruction. In the diagnosis period TC, for example, where the load 17 is a motor, a diagnosis is performed, such as whether the motor is correctly connected to the peripheral equipment (not illustrated), or whether a short circuit (power fault) to the power supply or a short circuit (ground fault) to the GND is generated. Further, in this embodiment, the offset adjustment of the current detection part 12 is performed in the diagnosis period TC. When there is no abnormality found in the diagnosis period TC within a predetermined time, the period shifts to the operation period TO, and the control circuit 20 causes the drive circuit 10 to drive. When there is an abnormality found, the control circuit 20 avoids the shift to the operation period TO, for example. The diagnosis period TC is set to about 100 ms, for example, in the case of an automobile power window.

In FIG. 3, (c) indicates the adjustment start signal to be output by the control circuit 20. In response to the operation start instruction from the user, the control circuit 20 supplies the adjustment start signal to the offset adjustment part 13. In FIG. 3, (d) indicates an adjustment period pulse. The offset adjustment part 13 generates the adjustment period pulse set to an arbitrary time in response to the adjustment start signal. In a period in which the adjustment period pulse is at an "H" level, the offset of the current detection part 12 is adjusted. The adjustment period pulse is set to fall within the diagnosis period TC.

In FIG. 3, (e) indicates the drive control signal to be supplied from the drive control part 14 to the drive element 15. For example, the drive control signal is a PWM signal with its duty ratio controlled. By adjusting the duty ratio of the drive control signal, the turning on/off of the drive element 15 is adjusted to control the supply of the load current IL to the load 17.

In the operation period TO, the current detection part 12 and the offset adjustment part 13 keep a state where the offset adjustment has been completed. Since a predetermined diagnosis ends in the diagnosis period TC and the drive circuit 10 operates in the operation period TO, it is possible to detect the load current IL while involving no dead zone of the load current and adjusting the input offset voltage VO to be smaller than the conventional voltage. In the operation period TO, the load current IL is supplied to the load 17. The operation period TO ends in response to the operation end instruction.

Figure 4:
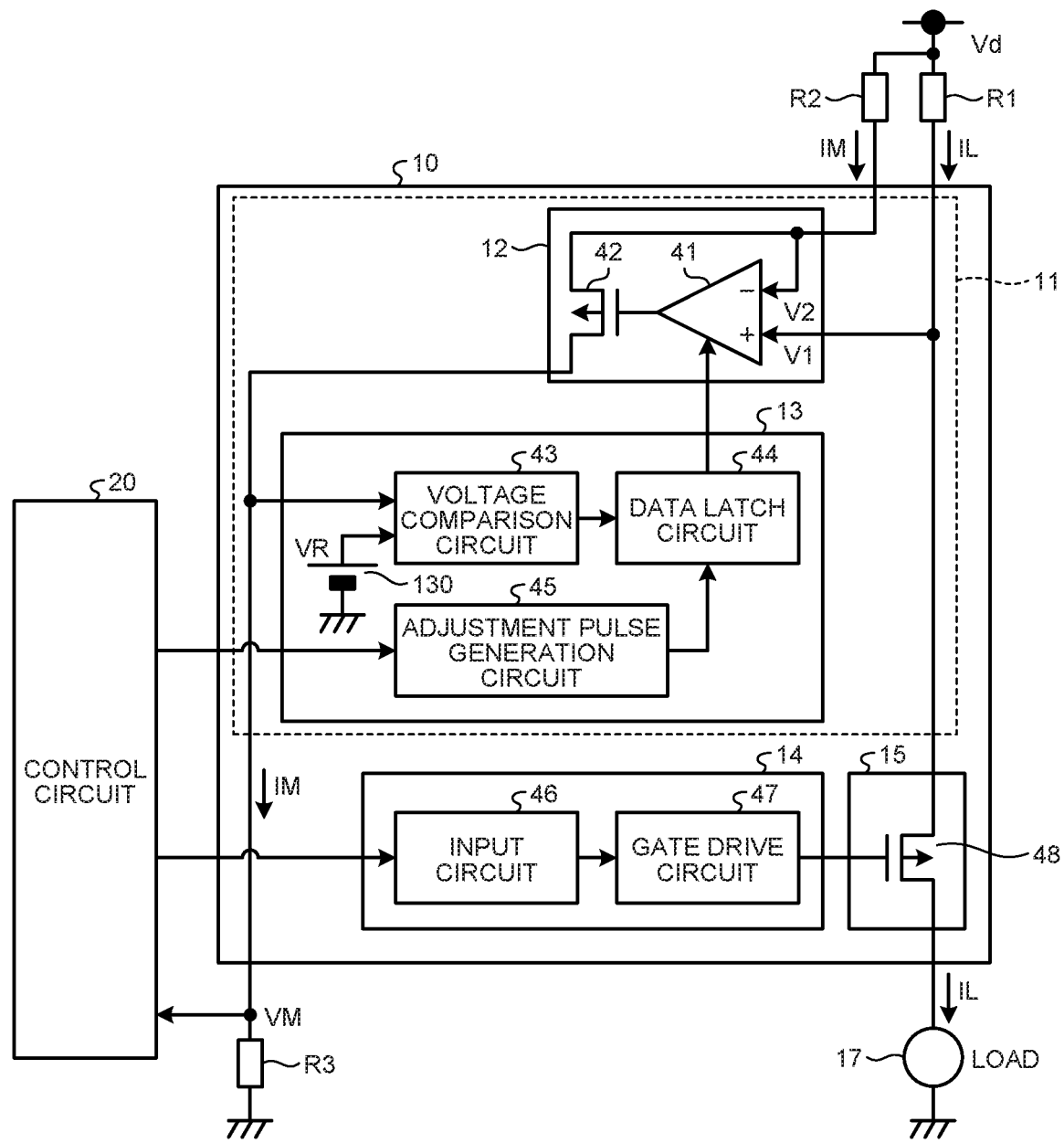
FIG. 4 is a diagram illustrating a specific configuration of the current detection system according to the first embodiment.

FIG. 4 is a diagram illustrating a specific configuration of the current detection system of FIG. 1. Here, the constituent elements corresponding to those of the embodiment described above are denoted by the same reference symbols, and their repetitive description will be made only when necessary. The same applies hereafter. The current detection part 12 in this embodiment includes an operational amplifier 41 and a PMOS transistor 42.

The non-inversion input terminal (+) of the operational amplifier 41 is connected to one end of the resistor R1 and supplied with a voltage V1. The voltage V1 is a voltage dropped from the power supply voltage Vd by a voltage generated in the resistor R1 by the load current IL. Thus, the voltage V1 decreases proportionally to the load current IL and becomes a voltage according to the load current IL. The inversion input terminal (−) of the operational amplifier 41 is connected to one end of the resistor R2 and supplied with a voltage V2. The voltage V2 is a voltage dropped from the power supply voltage Vd by a voltage generated in the resistor R2 by the monitor current IM. Thus, the voltage V2 decreases proportionally to the monitor current IM and becomes a voltage according to the monitor current IM. The operational amplifier 41 amplifies the difference voltage between the voltage V1 and the voltage V2, and supplies an output signal according to this difference voltage to the gate of the PMOS transistor 42 that serves as a switching element.

The operational amplifier 41 and the PMOS transistor 42 form a negative feedback circuit, and operate to make the voltage V1 and the voltage V2 equal to each other. Accordingly, the ratio between the load current IL and the monitor current IM can be set by the resistance ratio between the resistor R1 and the resistor R2. In the transistor 42, the source is connected to the other end of the resistor R2, the drain is connected to one end of the resistor R3. The transistor 42 is controlled by the output signal of the operational amplifier 41, and outputs the monitor current IM to the resistor R3. The monitor current IM is converted by the resistor R3 into the monitor voltage VM, which is then input to the offset adjustment part 13 and the control circuit 20.

The offset adjustment part 13 includes a voltage comparison circuit 43, a data latch circuit 44, and an adjustment pulse generation circuit 45. The voltage comparison circuit 43 supplies the result of comparing the monitor voltage VM with the reference voltage VR to the data latch circuit 44.

In response to the control signal (adjustment start signal) from the control circuit 20, the adjustment pulse generation circuit 45 generates the adjustment period pulse and sequential comparison pulses, and supplies these pulses to the data latch circuit 44. The adjustment period pulse defines an offset adjustment time. The sequential comparison pulses adjust the timing by which the data latch circuit 44 latches data. The data latch circuit 44 supplies the latched data to the operational amplifier 41, and adjusts the offset of the operational amplifier 41 to cause the monitor voltage VM to be equal to the reference voltage VR.

The drive control part 14 includes an input circuit 46 and a gate drive circuit 47. In response to the control signal (drive control signal) from the control circuit 20, the input circuit 46 generates a PWM signal, and supplies this signal to the gate drive circuit 47. The gate drive circuit 47 amplifies the PWM signal, and supplies this signal to the gate of a PMOS transistor 48 that constitutes the drive element 15. In response to the output signal of the gate drive circuit 47, the PMOS transistor 48 is turned on/off, and supplies the load current IL to the load 17.

According to this embodiment, the offset adjustment part 13 adjusts the offset of the operational amplifier 41 to cause the monitor voltage VM to be equal to the reference voltage VR. The offset adjustment is performed when the drive element 15 is off and the load current IL is zero. Even though the load current IL is zero, since the monitor voltage VM is generated, the load current IL can be thereby detected without the conventional dead zone entailed. Consequently, it is possible to avoid the situation where the load current IL is not detected even though the load current IL is flowing. Further, as the value of the reference voltage VR is set to such a potential that is close to the GND but slightly offset to the plus side, the convergence operation of the offset adjustment part 13 does not break down, and the offset of the operational amplifier 41 can be suppressed to a small value.

Figure 5:
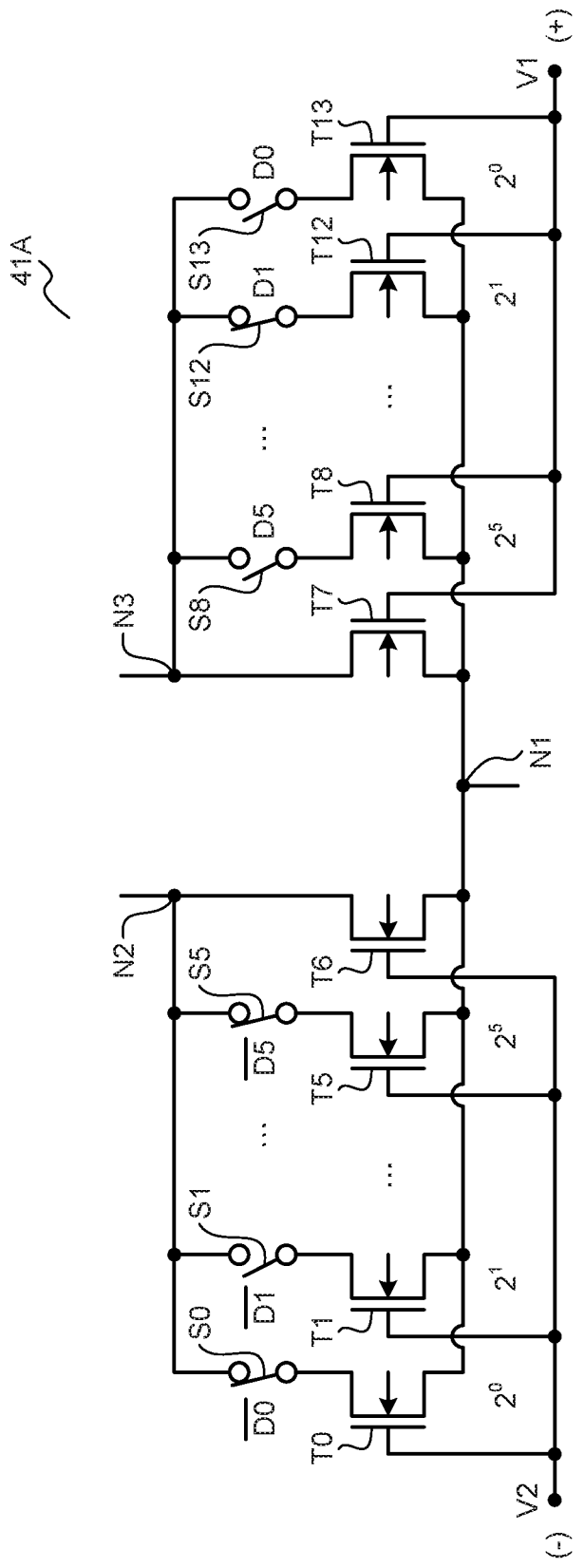
FIG. 5 is a diagram illustrating a configuration of an operational amplifier.

Next, an explanation will be given of an offset adjustment method, with reference to FIG. 5. FIG. 5 is a diagram illustrating one example of the circuit of a differential pair 41A that forms the input stage of the operational amplifier 41. FIG. 5 illustrates a case where the differential pair 41A is adjusted in the current drive capacity by an adjustment signal of six bits to adjust the offset. The differential pair 41A includes seven NMOS transistors T0 to T6 on the inversion input terminal (−) side and seven NMOS transistors T7 to T13 on the non-inversion input terminal (+) side. Here, in FIG. 5, for the sake of simplicity, four NMOS transistors are illustrated on each of the inversion input terminal (−) side and the non-inversion input terminal (+) side.

In each of the transistors T0 to T6, the source is connected to a terminal N1, and the gate is connected to the inversion input terminal (−). In each of the transistors T0 to T5, the drain is connected to a terminal N2 through the corresponding one of switches S0 to S5. In each of the transistors T7 to T13, the source is connected to the terminal N1, and the gate is connected to the non-inversion input terminal (+). In each of the transistors T8 to T13, the drain is connected to a terminal N3 through the corresponding one of switches S8 to S13. In other words, each of the switches S0 to S5 and S8 to S13 is connected in series to the main current path of the corresponding one of the transistors T0 to T5 and T8 to T13. The transistor T6 and the transistor T7 are always connected between the terminals N1 and N2 and between the terminals N1 and N3, respectively. Each of the terminals N2 and N3 is connected to an output terminal of the operational amplifier 41.

The transistors T6 and T7 are transistors that form a differential pair and serve mainly to differential amplification. The transistors T0 to T5 and T8 to T13 are additional transistors subsidiary to the main differential pair of transistors T6 and T7. Each of the transistors T6 and T7 is manufactured with a large element area as compared with the other transistors. Each of the transistors T0 to T5 and T8 to T13 has a current drive capacity, i.e., a source area, set in accordance with weighting of 2 to 25. The source area of each of the transistors T0 to T5 and T8 to T13 only needs to have a size capable of compensating for pair variations with respect to the main differential pair, and the resolution can be changed as necessary.

The connection states of the transistors T0 to T5 and T8 to T13 are controlled by turning on/off the switches S0 to S5 and S8 to S13, respectively. The turning on/off of the switches S0 to S5 and S8 to S13 is controlled by supplying data D0 to D5 and their inversion data /D0 to /D5 from the data latch circuit 44. When "H" level data is supplied to a switch, this switch is turned on and the transistor connected thereto is selected to form the differential pair 41A. The turning on/off of the switches S5 and S8 connected to the transistors T5 and T8 with the highest weighting is controlled by the most significant bit of the adjustment signal supplied from the data latch circuit 44. The current drive capacity of the differential pair 41A is adjusted by the combination of transistors to be connected in parallel to the main differential pair, so that the input offset voltage of the operational amplifier 41 is adjusted. The number of stages of transistors for making up the differential pair 41A is increased, and the number of times of offset adjustment, which is based on the comparison result between the reference voltage VR and the monitor voltage VM, is thereby increased. Consequently, it is possible to improve the accuracy in the offset adjustment of the operational amplifier 41 and to detect the load current IL with high accuracy.

Figure 6:
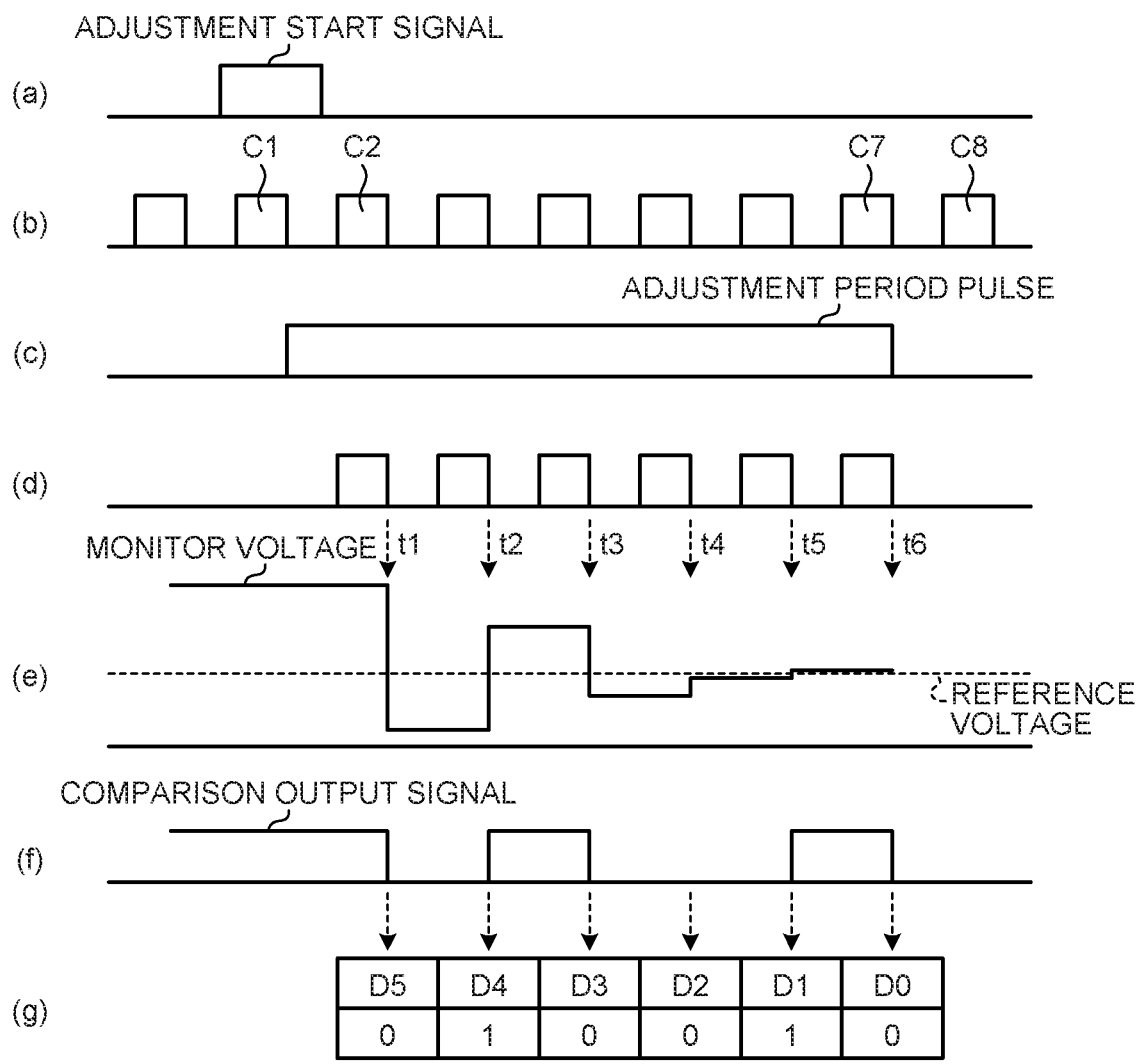
FIG. 6 is a timing chart illustrating an offset adjustment method of the operational amplifier.

FIG. 6 is a timing chart illustrating an offset adjustment method of the operational amplifier 41 illustrated in FIG. 4. FIG. 6 illustrates an example where the offset adjustment part 13 performs a sequential adjustment type operation. From the top, FIG. 6 sequentially shows (a) the adjustment start signal, (b) internal clock signals, (c) the adjustment period pulse, (d) the sequential comparison pulses, (e) the monitor voltage, (f) the comparison output signal, and (g) the data latch state. The internal clock signals of FIG. 6, (b), are generated by an internal clock generation circuit (not illustrated). The sequential comparison pulses of FIG. 6, (d), show a case where the bit length is six bits. For example, the sequential comparison pulses are generated in response to internal clock signals C2 to C7 in a period in which the adjustment period pulse is at an "H" level. In FIG. 6, (e), a solid line shows the monitor voltage VM, and a broken line shows the reference voltage VR.

When the adjustment start signal is input from the control circuit 20, the adjustment pulse generation circuit 45 generates the adjustment period pulse in synchronization with the falling edge of the internal clock signal C1 after the adjustment start signal. While the adjustment period pulse is at the "H" level, the adjustment pulse generation circuit 45 outputs the sequential comparison pulses to the data latch circuit 44. The voltage comparison circuit 43 compares the monitor voltage VM with the reference voltage VR, outputs the comparison result (comparison output signal) to the data latch circuit 44. The data latch circuit 44 takes in the comparison result at each of the falling edge timings t1 to t6 of the sequential comparison pulses. For example, the comparison output signal becomes an "H" level when the monitor voltage VM is higher than the reference voltage VR, and becomes an "L" level when the monitor voltage VM is lower than the reference voltage VR.

Specifically, the voltage comparison is performed while the transistors are fixed in order from one with the highest weighting. At the timing t1 of a state where the differential pair is formed of the transistors T6 and T7, the comparison between the monitor voltage and the reference voltage is performed, and then, in accordance with the comparison output signal thereby given, the transistors T5 and T8 are fixed. At the timing t1, since the monitor voltage VM is lower than the reference voltage VR, the comparison output signal becomes the "L" level. Thus, at the timing t1, the data latch circuit 44 takes in "0" as the data D5. Similarly, at each of the timings t2 to t6, the data latch circuit 44 takes in data according to the comparison output signal. The data D5 taken in at the timing t1 is the most significant bit.

As the weighting of a transistor is higher, the effect of the transistor on the offset adjustment is larger. Accordingly, in accordance with the comparison result of the voltage comparison circuit 43, the connection relationship is settled by sequentially selecting NMOS transistors in order from one with higher weighting. FIG. 6 illustrates a case where "0", "1", "0", "0", "1", and "0" are taken in as the data D5 to D0, as a result of sequential performance of the voltage comparison. Consequently, the offset adjustment of the operational amplifier 41 can be finished by six steps. The offset adjustment part 13 can adjust the offset of the operational amplifier 41 to cause the monitor voltage VM to converge step by step and become a potential closest to the reference voltage VR.

When the internal clock signals are set to 62.5 KHz, one cycle of the internal clock signals becomes 16 µs. When the differential pair is adjusted by sequential comparison pulses of six bits, at least seven cycles of the internal clock signals are used for the offset adjustment. When the offset adjustment time is set by cycles from the rising edge of the adjustment start signal to the internal clock signal C8 of the eighth cycle, the offset adjustment time becomes 128 µs. When the diagnosis period TC is set to 100 ms, the offset of the operational amplifier 41 can be adjusted within a time less than 1/100 of the diagnosis time TC, and thus this arrangement is practical.

Where one of the differential pair 41A is formed of each of the seven NMOS transistors, and the offset of the operational amplifier 41 is adjusted by data of six bits supplied from the data latch circuit 44, the offset adjustment can be performed by adjustment with $2^5=32$ gradations on one side, and thus can be performed with high accuracy by adjustment with resolution composed of 32 divisions.

The drive circuit 10 includes the operational amplifier 41 subjected to the offset adjustment, and supplies the load current IL to the load 17. Thereafter, before the drive control part 14 is operated, the offset adjustment of the operational amplifier 41 in the current detection part 12 is performed in accordance with the adjustment flow described above. Consequently, the load current IL can be supplied to the load 17, under a state where the offset has been adjusted, and thus it is possible to configure a current detection system that detects the load current IL with high accuracy.

In the case of a motor for an automobile body system, in general, the motor does not always operate but operates only when instructed by the user, while keeping the non-operational state until the next instruction is given. Since the motor does not necessarily start operating immediately after instructed by the user, a period for adjusting its own offset can be provided before the operation start, in use applications where the operation has a pause period. In the offset adjustment circuit according to this embodiment, the time necessary for self-diagnosis can be shortened sufficiently, and so the offset can be adjusted in a short time for each operation. Further, even if the input offset voltage varies due to changes with time or temperature drift, the adjustment can be performed each time.

Second Embodiment

Figure 7:
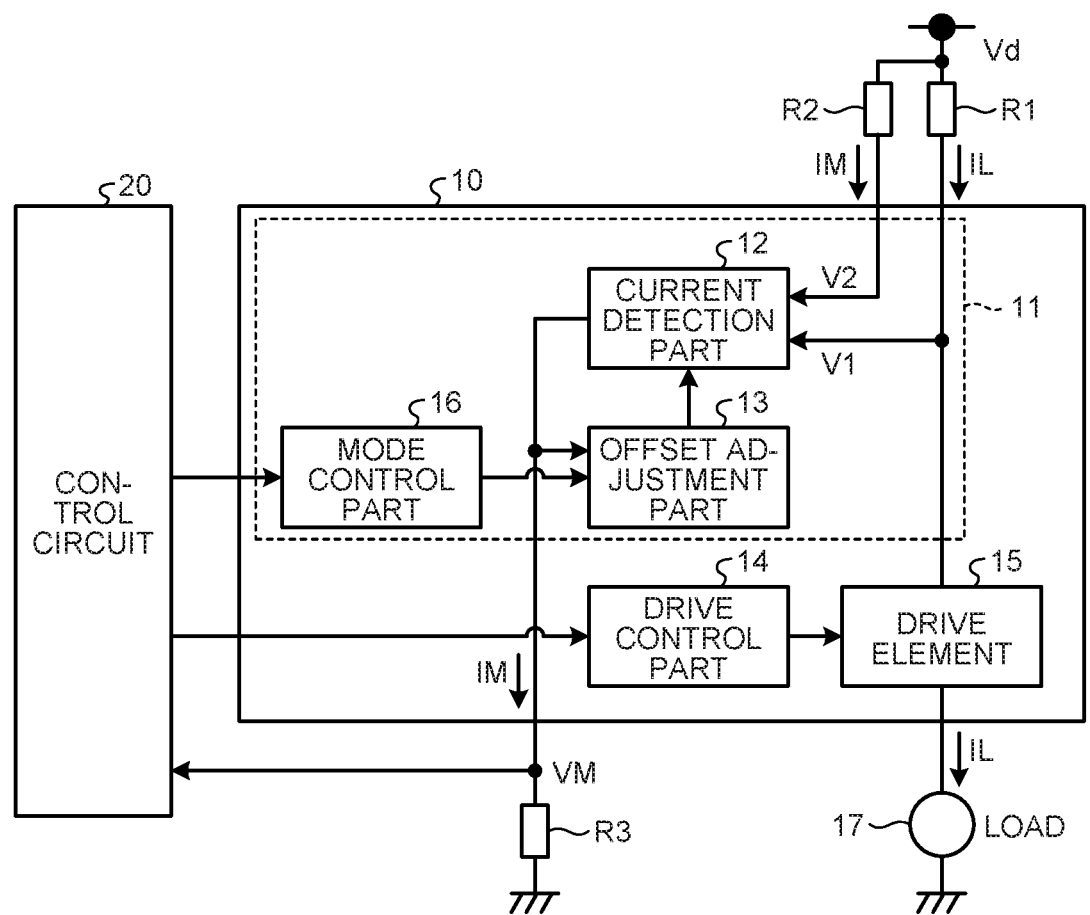
FIG. 7 is a diagram illustrating a configuration of a current detection system according to a second embodiment.

FIG. 7 is a diagram illustrating a configuration of a current detection system according to a second embodiment. In this embodiment, a pause period for stopping the operation of the drive circuit 10 is provided to suppress current consumption. In this embodiment, the current detection circuit 11 further includes a mode control part 16. The mode control part 16 is a circuit that controls a pause (standby) state and a normal operation state of the drive circuit 10. Specifically, in response to a mode control signal from the control circuit 20, the mode control part 16 cancels the pause state of the drive circuit 10. Then, the mode control part 16 generates a standby cancellation signal that starts the offset adjustment, and supplies this signal to the offset adjustment part 13. In the current detection system illustrated in FIGS. 1 and 4, an adjustment start signal is input from the control circuit 20. In this embodiment, no adjustment start signal is input from the control circuit 20.

In response to the standby cancellation signal, the offset adjustment part 13 starts the offset adjustment. For example, the mode control part 16 may include a so-called power-on reset circuit (not illustrated) that generates a reset signal in response to application of the power supply voltage Vd to the current detection circuit 11, and may use the reset signal generated by the power-on reset circuit as the offset adjustment start signal.

In this embodiment, in response to a signal of the mode control part 16, the offset adjustment of the operational amplifier 41 is started. Accordingly, there is no need to separately supply an adjustment start signal for starting the offset adjustment from the control circuit 20, and so the control circuit 20 can be less burdened. For example, where the control circuit 20 is formed of a microcomputer, the microcomputer performs various types of control, in general. Accordingly, as the control for starting an operation of the offset adjustment is transferred to the mode control part 16, the microcomputer can be less burdened.

Figure 8:
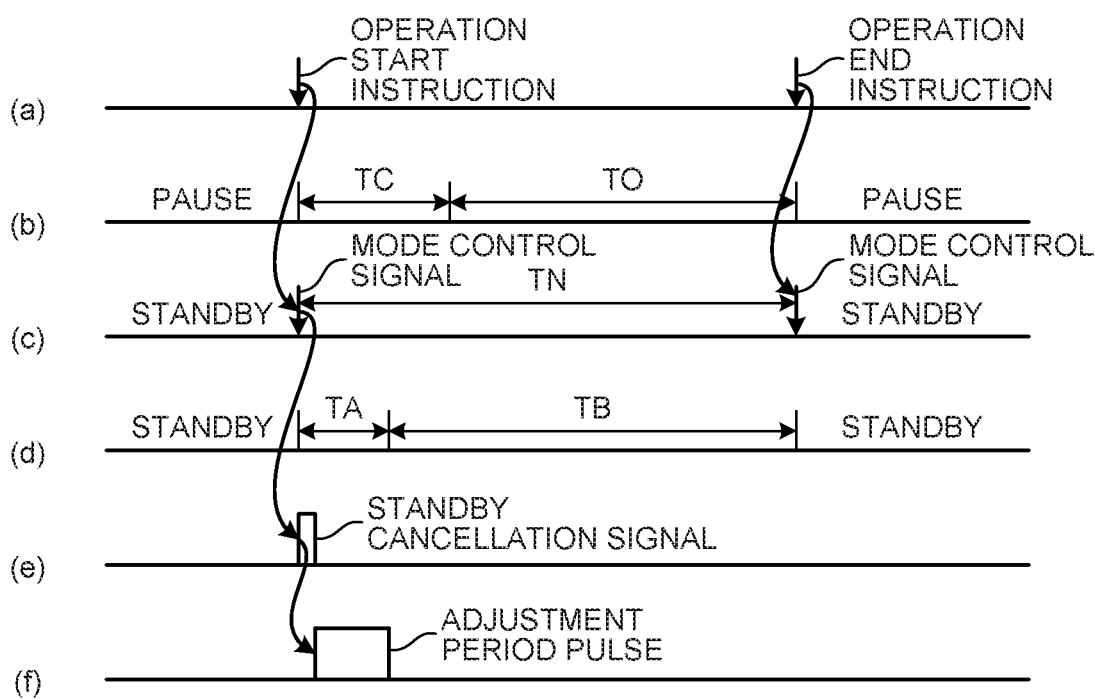
FIG. 8 is a timing chart illustrating an offset adjustment method.

FIG. 8 is a timing chart illustrating an offset adjustment method according to the second embodiment. In FIG. 8, (a) indicates an operation start instruction and an operation end instruction from the user. In FIG. 8, (b) indicates time distribution set by the control circuit 20. The diagnosis period TC starts in response to the operation start instruction. After a predetermined time, the period shifts to the operation period TO. The operation period TO ends in response to the operation end instruction, and returns to the pause state.

In FIG. 8, (c) indicates the timing of mode control signals to be supplied from the control circuit 20 to the mode control part 16. The control circuit 20 supplies a mode control signal for cancelling the standby state of the drive circuit 10 to the mode control part 16 at the timing of the operation start instruction, and supplies a mode control signal for shifting to the standby state at the timing of the operation end instruction. The current detection circuit 11 is in a standby cancellation state from the operation start instruction to the operation end instruction.

In FIG. 8, (d) indicates the internal state of the current detection circuit 11. When the standby cancellation state is entered and automatic adjustment is started, the offset of the current detection part 12 is adjusted within an automatic adjustment period TA determined by a clock frequency and the number of steps. The automatic adjustment period TA is set in the period of the diagnosis period TC. The drive control part 14 allows the load current IL to be supplied to the load 17 in a normal operation period TB after the automatic adjustment period TA ends. Since the automatic adjustment period TA ends within the diagnosis period TC, the load current IL can be supplied to the load 17 by the drive circuit 10 subjected to the offset adjustment, in the normal operation period TB. The current detection circuit 11 is set in the standby state after the operation end instruction.

In FIG. 8, (e) indicates the standby cancellation signal output by the mode control part 16. In FIG. 8, (f) indicates the adjustment period pulse generated by the offset adjustment part 13. In response to the standby cancellation signal, the offset adjustment part 13 generates the adjustment period pulse set to an arbitrary time in accordance with the number of stages of NMOS transistors constituting the differential pair 41A, the cycles of the internal clock signals, and so forth. In a period in which the adjustment period pulse is at an "H" level, the offset adjustment is performed. The offset adjustment in the period in which the adjustment period pulse is at the "H" level is the same as that of the first embodiment.

FIG. 9 is a flowchart illustrating the offset adjustment method. This is a flowchart based on the timing chart of FIG. 8. When the drive circuit 10 is in the standby state (S100), and the standby cancellation signal is supplied (S101: Yes), the offset adjustment of the operational amplifier 41 is started (S102). When the standby cancellation signal is not supplied (S101: No), the drive circuit 10 is kept in the standby state.

When the adjustment period TA has passed (S103: Yes), the drive control part 14 is allowed to operate (S104). When the adjustment period TA has not passed (S103: No), the drive circuit 10 prohibits the drive signal from the control circuit 20, and waits until the adjustment ends.

In the adjustment method according to this embodiment, a predetermined diagnosis ends in the automatic adjustment period TA set in the diagnosis time TC, and the drive circuit 10 is set in the normal operation state after the offset adjustment is performed. Since the drive circuit 10 is operated after the offset is adjusted in the automatic adjustment period TA, it is possible to detect the load current IL with high accuracy in the operation state of the drive circuit 10.

Further, in the adjustment method according to this embodiment, the mode control part 16 generates the standby cancellation signal in response to, each time, a mode output signal supplied from the control circuit 20, and the offset adjustment is automatically started. Accordingly, the control circuit 20 only supplies the mode control signal, and does not have to supply an adjustment start signal for starting the offset adjustment. Consequently, the control circuit 20 can be less burdened. As the control for the offset adjustment is transferred to the mode control part 16, the control circuit 20 can be less burdened.

In the embodiments, an explanation has been given of a configuration in which the offset adjustment part 13 includes the data latch circuit 44 that sequentially latches the comparison result of the voltage comparison circuit 43. However, a configuration using an up/down counter may be adopted in which data is updated in accordance with the comparison result of the voltage comparison circuit 43. Further, in this case, a configuration may be adopted in which the offset adjustment of the operational amplifier 41 ends when the count value of the up/down counter is converged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A current detection circuit comprising:
a current detection part including an operational amplifier configured to receive inputs of a first voltage proportional to a load current and a second voltage proportional to a detection current, and to be adjustable in an input offset voltage by data, the current detection part being configured to output the detection current on a basis of an output of the operational amplifier; and an adjustment part configured to generate the data in accordance with a result of comparing a monitor voltage proportional to the detection current with a reference voltage, and to adjust an offset of the operational amplifier, wherein the adjustment part includes a voltage comparison circuit configured to compare the monitor voltage with the reference voltage and output the data, a pulse generation circuit configured to generate a predetermined timing signal, and a latch circuit configured to latch the data in response to the timing signal.

2. The current detection circuit according to claim 1, wherein the adjustment part is configured to start adjustment of the offset in response to an adjustment start signal.

3. The current detection circuit according to claim 2, wherein the adjustment start signal is a standby cancellation signal for cancelling a standby state of the current detection part.

4. The current detection circuit according to claim 2, comprising a mode control part configured to generate the adjustment start signal and supply the adjustment start signal to the adjustment part.

5. The current detection circuit according to claim 4, wherein the mode control part is configured to generate the adjustment start signal in response to application of a power supply voltage.

6. The current detection circuit according to claim 1, configured to adjust the offset of the operational amplifier when a drive element that supplies the load current to a load is off, and then to turn on the drive element after adjustment of the offset of the operational amplifier is completed and to supply the load current to the load.

7. The current detection circuit according to claim 1, wherein the operational amplifier includes a differential pair to which an n-number of transistor pairs with current amplification rates sequentially adjusted in accordance with weighting of $2^n$ (n is 0 to n) are connected, and the adjustment part is configured to make one of each pair of the transistor pairs conductive by the data.

8. The current detection circuit according to claim 1, wherein the reference voltage is set to a value to be a voltage slightly in a positive direction with respect to a ground potential, and the current detection part is configured such that the detection current flows in accordance with the reference voltage when the load current is zero.

9. A current detection system comprising:

a drive element configured to supply a load current to a load;

a drive control part configured to supply a drive signal to the drive element to control supply of the load current to the load;

a current detection part including an operational amplifier configured to receive inputs of a first voltage proportional to the load current and a second voltage proportional to a detection current, and to be adjustable in an input offset voltage by data, the current detection part being configured to output the detection current on a basis of an output of the operational amplifier;

an adjustment part configured to generate the data in accordance with a result of comparing a monitor voltage proportional to the detection current with a reference voltage, and to adjust an offset of the operational amplifier; and a control circuit configured to supply an adjustment start signal for starting adjustment of the offset by the adjustment part, wherein the adjustment part includes a voltage comparison circuit configured to compare the monitor voltage with the reference voltage and output the data, a pulse generation circuit configured to generate a predetermined timing signal, and a latch circuit configured to latch the data in response to the timing signal.

10. The current detection system according to claim 9, wherein the adjustment start signal is a standby cancellation signal for cancelling a standby state of the current detection part.

11. The current detection system according to claim 9, comprising a mode control part configured to generate the adjustment start signal and supply the adjustment start signal to the adjustment part.

12. The current detection system according to claim 11, wherein the mode control part is configured to generate the adjustment start signal in response to application of a power supply voltage.

13. The current detection system according to claim 9, wherein the reference voltage is set to a value to be a voltage slightly in a positive direction with respect to a ground potential, and the current detection part is configured to output the detection current in accordance with the reference voltage when the load current is zero.

14. A method of adjusting a current detection circuit that includes a current detection part including an operational amplifier configured to amplify a difference voltage between a first voltage proportional to a load current and a second voltage proportional to a detection current that is a current reduced at a predetermined ratio with respect to the load current, the method comprising:

comparing a monitor voltage proportional to the detection current with a reference voltage; and adjusting an offset of the operational amplifier to cause the monitor voltage to be equal to the reference voltage, wherein the adjusting includes comparing the monitor voltage with the reference voltage and outputting the data, generating a predetermined timing signal, and latching the data in response to the timing signal.

15. The method of adjusting a current detection circuit according to claim 14, wherein the method comprises starting adjustment of the offset of the operational amplifier in response to a cancellation signal for cancelling a standby state of the current detection part.

16. The method of adjusting a current detection circuit according to claim 14, wherein the method comprises starting adjustment of the offset of the operational amplifier in response to a reset signal that is generated in response to application of a power supply voltage to the current detection circuit.

17. The method of adjusting a current detection circuit according to claim 14, wherein the method comprises adjusting the offset of the operational amplifier when a drive element that outputs the load current is off, and then turning on the drive element after adjustment of the offset of the operational amplifier is completed and supplying the load current to the load.

18. The method of adjusting a current detection circuit according to claim 14, wherein the operational amplifier includes a differential pair to which a plurality of transistors adjusted in size in accordance with predetermined weighting are connected in parallel, and the method comprises selecting transistors to adjust the offset of the operational amplifier, in order from a transistor larger in weighting among the plurality of transistors.

* * * * *